United States Patent [19]
Delforge

[11] 4,146,931
[45] Mar. 27, 1979

[54] DIGITAL FILTER

[75] Inventor: Jean-Marie Delforge, Saint-Omer, France

[73] Assignee: International Standard Electric Corporation, New York, N.Y.

[21] Appl. No.: 876,597

[22] Filed: Feb. 10, 1978

[30] Foreign Application Priority Data

Feb. 4, 1977 [FR] France ............................. 77 03142

[51] Int. Cl.² ............................................. G11C 13/00
[52] U.S. Cl. .................................... 364/724; 333/202; 365/244
[58] Field of Search ............ 365/244; 333/70 R, 70 A

[56] References Cited

U.S. PATENT DOCUMENTS 3,772,659  11/1973  DeVries ............................... 365/244

Primary Examiner—Terrell W. Fears
Attorney, Agent, or Firm—John T. O'Halloran; Jeffrey P. Morris

[57] ABSTRACT

A digital filter configuration incorporating read-only memories for coefficient storage is disclosed in which substantial reduction in memory requirements is achieved. Two read-only memories are addressed by only three arguments for a second-order filter or five arguments for a fourth-order filter.

5 Claims, 4 Drawing Figures

DIGITAL FILTER

BACKGROUND OF THE INVENTION

1. Field of the Invention

This invention concerns a digital filter in which samples are weighted by addressing a memory.

2. Description of the Prior Art

A memory has already been used, in the prior art of digital filters as a means to simplify or even eliminate multiplication operations. The digital filters in that case consist mainly of shift or delay operators, add or subtract operators and multiply operators using a read-only memory. In an article appearing in the American Review: IEEE Transactions, Vol. ASSP-22, No. 6, December 1974, and entitled "A new hardware realization of digital filters", Abraham PELED and Bede LIU present a new approach for the design of digital filters making use of recent advances in the technology of semiconductors and especially of programmable read-only memories. As it will be seen below, the solution proposed by the authors for the design of a second-order filter cell simplifies the arithmetic operation but requires the storage of $2^5$ values. But, since one of the advantages of digital filtering is the possibility, on the one hand, of modifying the basic cell while changing only the coefficients and, on the other hand, of designing filters of an order higher than two by several runs of the samples to be filtered in the same basic cell but with different coefficients, it is obvious that the required storage volume increases very rapidly.

SUMMARY OF THE INVENTION

So one object of this invention is to provide a digital filter in which samples are weighted by the addressing of a memory.

Another object of the invention is to provide a digital filter which requires a reduced memory volume in accordance with the above technique.

Another object of the invention is to provide a digital filter which uses only one accumulator.

Another object of the invention is a digital filter which can be used in multiplexed operation by several users.

The invention consists of a digital filter adapted for the filtering of successive binary coded input samples $X(n)$ in the form:

$$X(n) = \sum_{j=1}^{j=B-1} 2^{-j} \cdot X_j(n) - X_0(n)$$

in which n is the number of the sample, B is the number of bits, and furnishing a series of coded values $Y(n)$ linked to the said input samples by the following expression:

$$Y(n) = \sum_{i=0}^{i=m} \alpha i \cdot X(n - i) - \sum_{i=1}^{i=m} \beta i \cdot Y(n - i)$$

in which m is the order of the filter, $\alpha i$ and $\beta i$ are weighting factors characterized in that it includes:

a first memory furnishing a first value $\phi_j(Y)$ from $m+1$ address bits;

a second memory furnishing a second value $\phi_j(W)$ from the same $m+1$ address bits;

first means to combine the said successive first values $\phi_j(Y)$ so as to obtain a final value:

$$Y(n) = \sum_{j=1}^{j=B-1} \phi_j(Y) \cdot 2^{-j} - \phi_0(Y);$$

second means to combine the said successive values $\phi_j(W)$ so as to obtain an intermediate value:

$$W(n) = \sum_{j=1}^{j=B-1} \phi_j(W) \cdot 2^{-j} - \phi_0(W);$$

third means to apply serially to the said first and second memories the B bits of the said input sample $X(n)$; fourth means to apply serially to the said first and second memories the B bits of each of the said intermediate values $W(n-1)$ to $W(n-m)$, the m $j^{th}$ bits of the said intermediate values constituting with the $j^{th}$ bit of the said input sample the $m+1$ address bits of the said memories; and in that the said first value $\phi_j(Y)$ is linked to the said $m+1$ address bits by the expression:

$$\phi_j(Y) = X_j(n) + (\alpha_1 - \beta_1) \cdot W_j(n-1) + (\alpha_2 - \beta_2) \cdot W_j(n-2) \ldots + (\alpha m - \beta m) \cdot W_j(n-m)$$

and the said second value $\phi_j(W)$ is linked to the said $m+1$ address bits by the expression:

$$\phi_j(W) = X_j(n) - \beta_1 \cdot W_j(n-1) - \beta_2 \cdot W_j(n-2) \ldots - \beta m \cdot W_j(n-m).$$

According to one characteristic of the invention, the said first means and the said second means include:

an adder-subtractor receiving at one input the said first value or the said second value;

a register whose input is connected to the output of the said adder-subtractor; and a 2:1 divider circuit whose input is connected to the output of the said register and whose output is connected to a second input of the said adder-subtractor.

According to another characteristic of the invention, the said first and second values are applied to the said first means which are then used in multiplexed operation by the said first and second memories.

Other objects, characteristics and advantages of this invention will be brought out more clearly in the following description of a particular embodiment, given simply as an illustration, in connection with the attached drawings in which:

DESCRIPTION OF THE PREFERRED EMBODIMENTS

Figure 1:
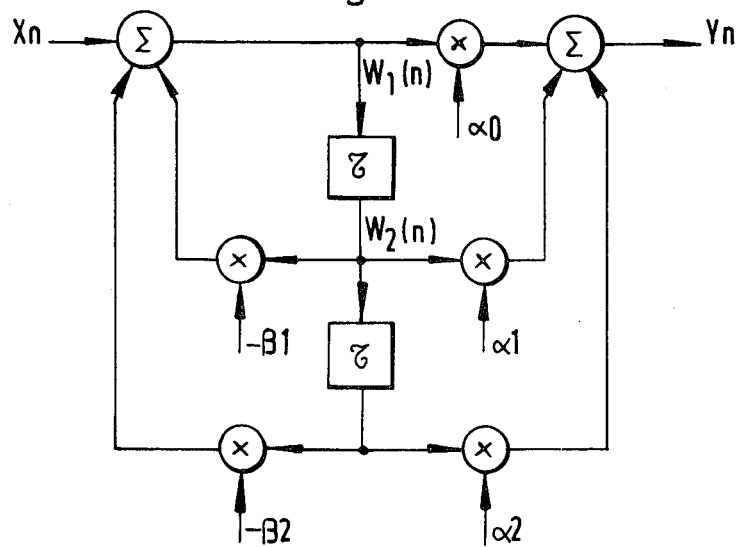
FIG. 1 is a representation in canonical form of a second-order filter.

A digital filter is characterized by a relationship between the input and output in the form:

$$Y(n) = \sum_{k=0}^{k=n} \alpha k \cdot X(n-k) - \sum_{k=1}^{k=n} \beta k \cdot Y(n-k) \quad (1)$$

in which $\{\alpha k, \beta k\}$ represent coefficients, usually constants, and $\{X(i), Y(i)\}$ represent the values of successive samples at the input and at the output respectively. FIG. 1 represents a second-order digital filter cell in canonical form. This representation is called canonical because it requires only a minimum number of adders (designated $\Sigma$), multipliers (designated X) or delay circuits (designated $\tau$).

Figure 2:
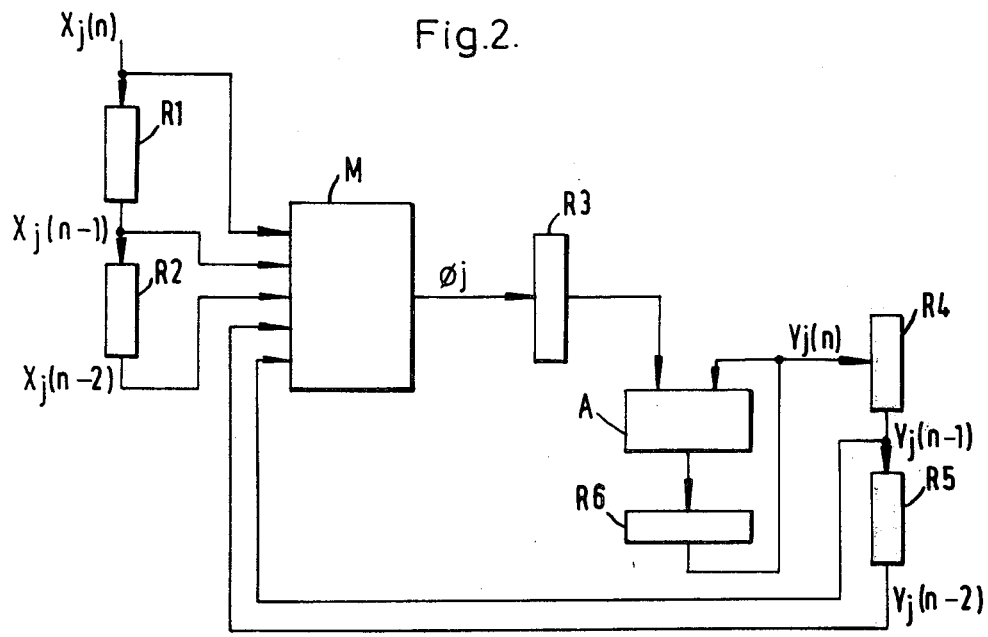
FIG. 2 shows a familiar design of a second-order digital filter.

The diagram of FIG. 2 shows a familiar design of a second-order digital filter. This circuit was described in the above mentioned article written by Abraham PELED and Bede LIU, and corresponds to a direct use of the equation:

$$Y(n) = a_0.X(n) + a_1.X(n-1) + a_2.X(n-2) - b_1.Y(n-1) - b_2.Y(n-2) \quad (2).$$

The shift registers R1 and R2 permit $X(n-1)$ and $X(n-2)$ to be obtained from the input sample $X(n)$; similarly, shift registers R4 and R5 permit $Y(n-1)$ and $Y(n-2)$ to be obtained from the output sample $Y(n)$. For each input vector $\{X_j(n), X_j(n-1), X_j(n-2), Y_j(n-1), Y_j(n-2)\}$ a read-only memory M supplies a value $\phi_j$ which corresponds to the j bit of the different variables in equation (2). This value $\phi_j$ is entered in the register R3 whose output is connected to one of the two inputs of accumulator A. The other input to accumulator A is connected to an output register R6 which contains the previous value of the said accumulator shifted by one bit position. After a number B of shifts (if B is the number of bits of the samples), the content of register R6 represents the output sample $Y(n)$. The solution desired above has been made possible by recent advances in the technology of semi-conductor programmable memories. It simplifies the arithmatic operation, compared with conventional cells using multiplication operators. However, this solution requires a memory containing $2^5 = 32$ separate values corresponding to the possible values of $\phi_j$. Now, it is possible to reduce the required memory volume by a factor of two by using the principles of this invention.

Referring again to the diagram in FIG. 1, the state equations of this cell can be written, letting $\alpha_0 = 1$:

$$W_1(n) = X(n) - \beta_1.W_2(n) - \beta_2.W_2(n-1) \quad (3)$$

$$Y(n) = W_1(n) + \alpha_1.W_2(n) + \alpha_2.W_2(n-1) \quad (4)$$

or else, since: $W_2(n) = W_1(n-1)$ $$W_1(n) = X(n) - \beta_1.W_1(n-1) - \beta_2.W_1(n-2) \quad (5)$$

$$Y(n) = X(n) + (\alpha_1-\beta_1).W_1(n-1) + (\alpha_2-\beta_2).W_1(n-2) \quad (6).$$

Equations (5) and (6) show that, for a second-order digital filter, the evolution is given by a knowledge of the new input sample $X(n)$ and of the two preceding state variables $W_1(n-1)$ and $W_1(n-2)$. A reduction of the required memory volume is then possible by a design similar in principle to that of FIG. 2. Equations (5) and (6) can be written in the following simplified form:

$$y = a.u + b.v + c.w \quad (7)$$

in which a, b and c are constants and u, v, and w are variables. The two's-complement representation of binary numbers is most appropriate for digital filter implementation using serial arithmetic, because additions may proceed with no advance knowledge of the signs and relative amplitudes of the binary numbers being added. Thus, a binary number u can be written:

$$u = -u_0 + \sum_{j=1}^{j=B-1} u_j \cdot 2^{-j}$$

with $u_j$ equal either to 0 or 1 and $u_0$ representing the sign bit. With this representation, the data u is within the interval $-1 \leq u < 1$ and it includes B bits.

Equation (7) can then be written:

$$Y = a\left[\sum_{j=1}^{B-1} u_j \cdot 2^{-j} - u_0\right] + b\left[\sum_{j=1}^{B-1} v_j \cdot 2^{-j} - v_0\right] + c\left[\sum_{j=1}^{B-1} w_j \cdot 2^{-j} - w_0\right] \quad (8)$$

or else:

$$Y = \sum_{j=1}^{B-1} 2^{-j}[a \cdot u_j + b \cdot v_j + c \cdot w_j] - [a \cdot u_0 + b \cdot v_0 + c \cdot w_0] \quad (9).$$

If we let: $\phi_j = au_j + bv_j + cw_j$, we obtain:

$$Y = \sum_{j=1}^{B-1} 2^{-j} \cdot \phi_j - \phi_0 \quad (10).$$

The function $\phi_j$ depends on only three binary arguments and, since each has the value of 0 or 1, this function can assume only $2^3 = 8$ distinct values. These various values of $\phi_j$ can be entered in a read-only memory whose addresses consist of various values of the binary vector $\{u_j, v_j, w_j\}$.

Equations (5) and (6) then become:

$$W_1(n) = \sum_{j=1}^{B-1} 2^{-j} \cdot \phi_j W - \phi_0 W \quad (11)$$

$$Y(n) = \sum_{j=1}^{B-1} 2^{-j} \cdot \phi_j Y - \phi_0 Y \quad (12)$$

with $\phi_j W = X_j(n) - \beta_1.W_j(n-1) - \beta_2.W_j(n-2)$ and $\phi_j Y = X_j(n) + (\alpha_1-\beta_1).W_j(n-1) + (\alpha_2-\beta_2).W_j(n-2)$.

The functions $\phi W$ and $\phi Y$ depend on the same binary arguments $\{X_j(n), W_j(n-1), W_j(n-2)\}$ and the equations (11) and (12) can be calculated using only add and shift operators.

Figure 3:
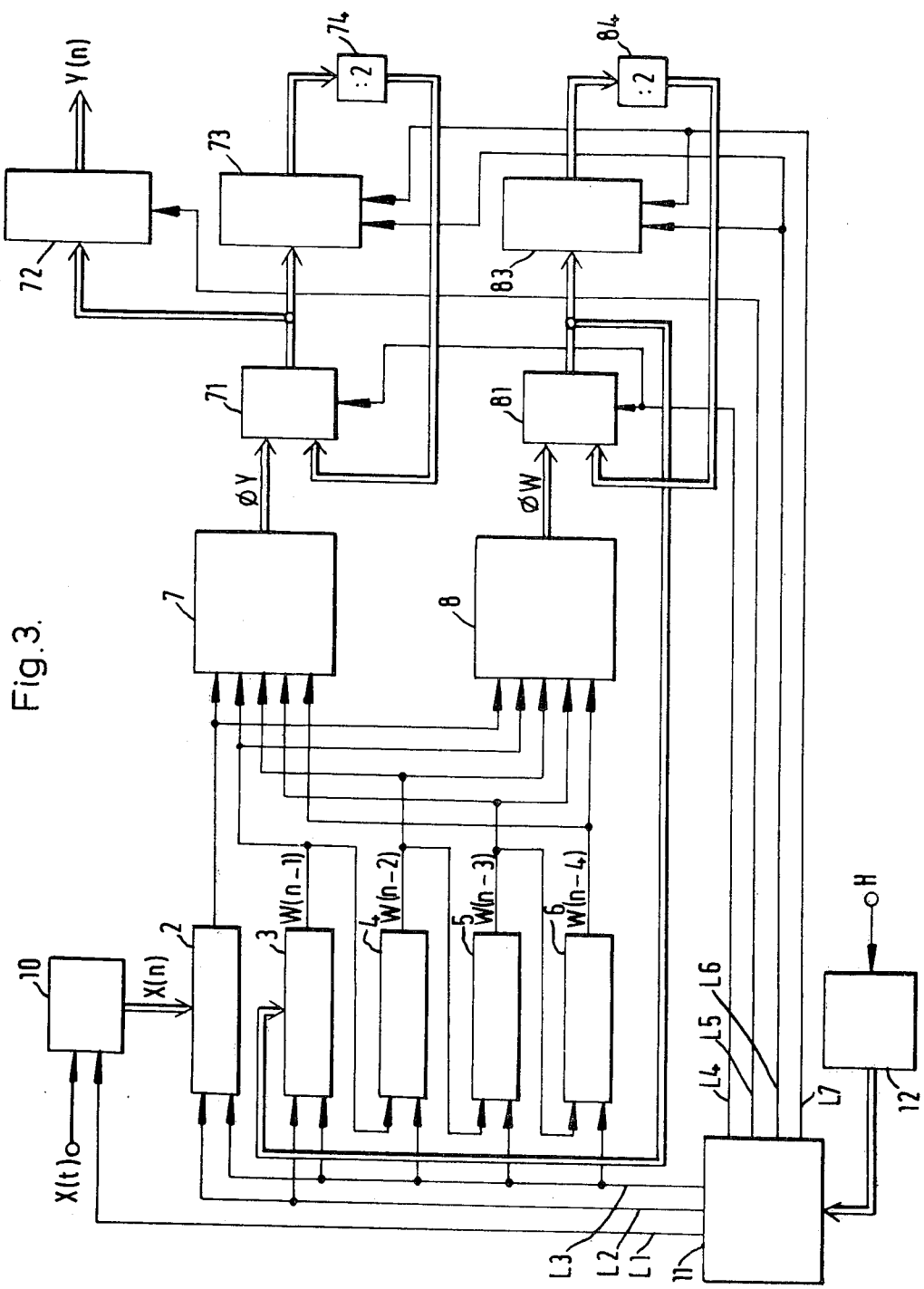
FIG. 3 shows a fourth-order digital filter in accordance with the principles of the invention.
Figure 4:
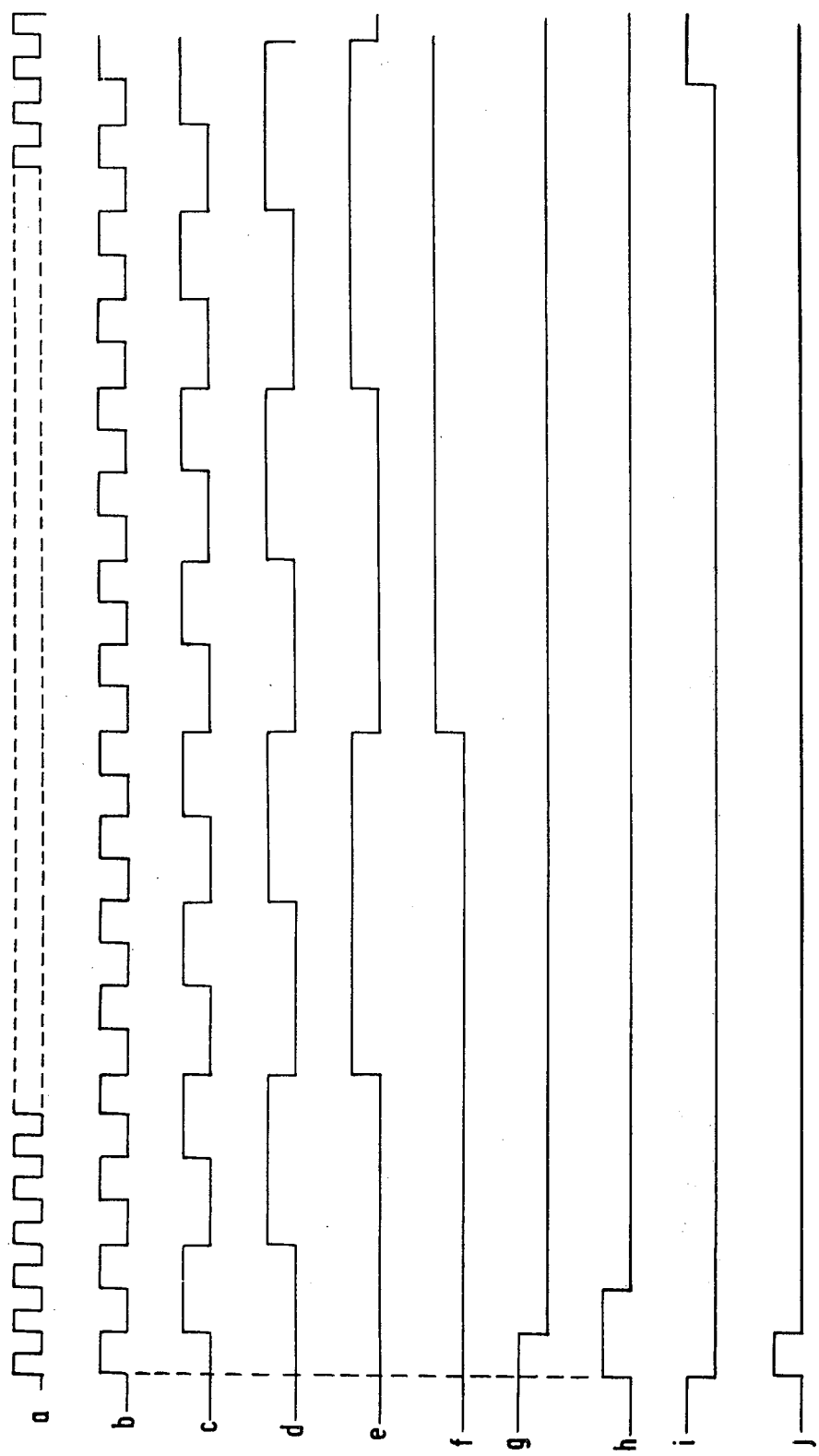
FIG. 4, consisting of A through J, is a diagram of the signals involved in the operation of the digital filter in FIG. 3.

The diagram of FIG. 3 shows the design of a fourth-order filter cell using the principles of the invention, and FIG. 4 shows the various signals involved in its operation. For a fourth-order cell, the functions $\phi W$ and $\phi Y$ depend on five arguments $\{X(n), W(n-1), W(n-2), W(n-3), W(n-4)\}$. The five binary arguments are used to address a first read-only memory 7 giving the value of the function $\phi Y$ and a second read-only memory 8 giving the value of the function $\phi W$.

The functions $\phi Y$ and $\phi W$ obtained at the outputs of read-only memories 7 and 8 are applied respectively to one input of an adder-subtractor 71 and an adder-subtractor 81. The output of each adder-subtractor 71 or 81 is applied to an accumulator register 73 or 83 whose output, after a shift of one position by a 2:1 divider 74 or 84, is applied to a second input of the adder-subtractor 71 or 81. The output of adder-subtractor 71 is also applied to an output register 72. The output of adder-subtractor 81 is also applied to the input of register 3 whose output represents the binary argument W(n−1). The other binary arguments X(n), W(n−2), W(n−3) and W(n−4) are obtained at the output of registers 2, 4, 5 and 6 respectively. Register 2 is a parallel-serial register, as register 3 is, and it receives the samples X(n) from coder 10. Registers 4, 5 and 6 are shift registers. The various control signals, present on lines L1 to L7, are obtained by decoding in circuit 11 information supplied by a counter 12 which is controlled by a clock signal H.

The operation of the fourth-order filter cell is similar to that of the second-order cell described in the above mentioned article. On the other hand, the filter cell according to the invention requires only one eighth as much memory volume as a canonical design of the fourth order. The diagram in FIG. 4 shows the various control signals. We find in order from "a" to "j": the clock signal H applied to counter 12, a clock signal applied to accumulator registers 73 and 83 and to registers 2 to 6, the output information from counter 12 (from "c" to "f"), a loading signal applied to registers 2 and 3, a loading signal applied to the output register 72, the add-subtract control signal applied to the adders-subtractors 71 and 81 and a reset signal applied to the said accumulator registers 73 and 83. Also shown, in "h" of FIG. 4 is the sampling pulse in the form of an arrow.

The input magnitude to be filtered X(t) is sampled in coder 10 controlled by the sampling pulse supplied by the decoder 11 over line L1. The sample X(n) is composed of sixteen bits in the example in question and the sixteen bits are stored in parallel in register 2 under the control of the loading signal supplied by the decoder 11 over line L2. Register 3 is loaded, at the same time as register 2 and on the same control signal, with the sixteen output bits from adder-subtractor 81 representing the variable W(n−1). Registers 4, 5 and 6 are shift registers receiving at their input the output bits from the preceding registers. The output frequency of the bits from registers 2 to 6 is determined by the clock signal supplied by decoder 11 over line L3. The output bits from registers 2 to 6 constitute the address, applied to read-only memories 7 and 8, to which the functions $\phi Y$ and $\phi W$ correspond respectively. In fact, at a given instant, the output of read-only memories 7 and 8 represents only the values $\phi_j Y$ and $\phi_j W$ corresponding to the j bit of the variables X(n), W(n−1), ..., W(n−4). Circuits 71, 73 and 74 carry out in the usual manner the function (12):

$$Y(n) = \sum_{j=1}^{15} 2^{-j} \cdot \phi_j Y - \phi_0 Y$$

and circuits 81, 83 and 84 carry out the function (11):

$$W_1(n) = \sum_{j=1}^{15} 2^{-j} \cdot \phi_j W - \phi_0 W.$$

Circuits 71 and 81 operate as adders or subtractors, under the control of the signal supplied by decoder 11 over line L4 as shown in "i" of FIG. 4, depending upon whether j is other than or equal to zero. The most significant bit, that is to say when j = 0, is the sign bit. After sixteen clock pulses, the output of the adder-subtractor 71 represents the value of the output sample Y(n) which is then stored in the output register 72 under the control of a signal supplied by decoder 11 on line L5 and shown at "h" in FIG. 4. Simultaneously, accumulator registers 73 and 83 are reset by a control signal furnished by decoder 11 on line L7 shown at "j" in FIG. 4. The device in FIG. 3 is again ready to process a new sample of input magnitude X(t).

The diagram shown in FIG. 3 represents only one of the possible designs of the invention. For instance, a filter cell of an order higher or lower than four could be designed. For a second-order filter cell, only three variables are required to address the memories, and an eighth-order filter cell could be obtained either by four passes through a second-order cell, or by two passes through a fourth-order cell. Furthermore, it is possible in certain applications to multiplex part or all of the basic cell; for example, the input can be multiplexed over several signals of different origin, or a single accumulator can process in multiplexed operation the outputs of the two read-only memories.

Thus, while the present invention has been described in connection with a preferred embodiment, thereof, it is to be understood that additional modifications, embodiments and applications which will become apparent to those skilled in the art are included within the spirit and scope of the invention as set forth by the claims appended hereto.

I claim:

1. A digital filter for filtering successive binary coded input samples X(n) in the form:

$$X(n) = \sum_{j=1}^{j=B-1} 2^{-j} \cdot X_j(n) - X_0(n)$$

in which n is the number of the sample, B is the number of bits, per sample, and furnishing a series of coded values Y(n) related to the said input samples by the relationship:

$$Y(n) = \sum_{i=0}^{i=m} \alpha i \cdot X(n-i) - \sum_{i=1}^{i=m} \beta i \cdot Y(n-i)$$

in which m is the order of the filter, $\alpha i$ and $\beta i$ are weighting factors, comprising:
  first memory means furnishing a first value $\phi_j(Y)$ from m+1 address bits;
  second memory means furnishing a second value $\phi_j(W)$ from the same m+1 address bits;
  first means to combine the said successive first values $\phi_j(Y)$ so as to obtain a final value:

$$Y(n) = \sum_{j=1}^{j=B-1} \phi_j(Y) \cdot 2^{-j} - \phi_0(Y);$$

second means to combine the said successive second value $\phi_j(W)$ so as to obtain an intermediate value:

$$W(n) = \sum_{j=1}^{j=B-1} \phi_j(W) \cdot 2^{-j} - \phi_0(W);$$

third means to apply serially to the said first and second memory means the B bits of the said input sample X(n);
  fourth means to apply serially to the said first and second memory means the B bits of each of the said intermediate values W(n−1) to W(n−m), the m $j^{th}$ bits of the said intermediate values constituting with the $j^{th}$ bit of the said input sample the m+1 address bits of the said memories; and in that the said first value $\phi_j(Y)$ is related to the said $m+1$ address bits by the relationship:

$$\phi_j(Y) = X_j(n) + (\alpha_1 - \beta_1) \cdot W_j(n-1) + (\alpha_2 - \beta_2) \cdot W_j(n-2) \ldots + (\alpha_m - \beta_m) \cdot W_j(n-m)$$

and the second value $\phi_j(W)$ is related to the said $m+1$ address bits by the relationship:

$$\phi_j(W) = X_j(n) - \beta_1 \cdot W_j(n-1) - \beta_2 \cdot W_j(n-2) \ldots - \beta_m \cdot W_j(n-m).$$

2. A digital filter according to claim 1, wherein said first means and the said second means include:
adder-subtractor means receiving at one input thereof said first value or said second value;
register means having an input which is connected to the output of said adder-subtractor means; and
a divide-by-two divider circuit having an input which is connected to the output of said register means and having an output which is connected to a second input of said adder-subtractor means.

3. A digital filter according to claim 1 wherein said first and second values are applied to the said first means which are then used in multiplexed operation by the said first and second memory means.

4. A digital filter according to claim 1 wherein said third means comprises parallel-serial register means receiving in parallel the B bits of the input sample $X(n)$.

5. A digital filter according to claim 1 wherein said fourth means comprises m shift registers of B bits arranged serially, the first of said shift registers receiving the said intermediate value $W(n)$ and the outputs of said shift registers representing the intermediate values $W(n-1)$ to $W(n-m)$ respectively.

* * * * *